United States Patent
Tsao et al.

(10) Patent No.: US 6,818,319 B2
(45) Date of Patent: Nov. 16, 2004

(54) DIFFUSION BARRIER MULTI-LAYER STRUCTURE FOR THIN FILM TRANSISTOR LIQUID CRYSTAL DISPLAYS AND PROCESS FOR FABRICATING THEREOF

(75) Inventors: I-Chang Tsao, Hsinchu (TW); Ming-Wei Sun, Kaohsiung Hsien (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/414,282

(22) Filed: Apr. 16, 2003

(65) Prior Publication Data

US 2004/0157382 A1 Aug. 12, 2004

(30) Foreign Application Priority Data

Feb. 11, 2003 (TW) ........................................ 92102796 A

(51) Int. Cl.$^7$ ...................... H01L 29/02; H01L 27/095; H01L 29/12
(52) U.S. Cl. ...................... 428/620; 428/641; 428/687; 428/409; 428/312.6; 428/304.4; 428/307.3; 428/446; 428/704; 428/698; 257/486
(58) Field of Search .................................. 428/620, 641, 428/687, 409, 312.6, 304.4, 307.3, 446, 704, 698; 257/486

(56) References Cited

U.S. PATENT DOCUMENTS 6,329,270 B1 * 12/2001 Voutsas ....................... 438/488
6,399,454 B1 * 6/2002 Yamazaki ................... 438/308

\* cited by examiner

*Primary Examiner*—Deborah Jones
*Assistant Examiner*—Ling Xu
(74) *Attorney, Agent, or Firm*—Troxell Law Office PLLC

(57) ABSTRACT

A diffusion barrier multi-layer structure for a TFT LCD by the LTPS process and the process for fabricating thereof are disclosed. By increasing the coarseness between two layers of the diffusion barrier multi-layer structure with a plasma treatment, or by forming a loose and porous impurity collecting layer between two layers of the diffusion barrier multi-layer structure to trap the impurity atoms, the impurity diffusion can be effectively obstructed.

9 Claims, 2 Drawing Sheets

DIFFUSION BARRIER MULTI-LAYER STRUCTURE FOR THIN FILM TRANSISTOR LIQUID CRYSTAL DISPLAYS AND PROCESS FOR FABRICATING THEREOF

FIELD OF THE INVENTION

The present invention relates to the fabrication of thin film transistor (TFT) liquid crystal displays and, more specifically, to a diffusion barrier multi-layer structure for a liquid crystal display of low-temperature poly Si (LTPS) thin film transistors.

BACKGROUND OF THE INVENTION

With the advance of techniques for manufacturing thin-film transistors, the liquid crystal displays (LCD) are widely applied in various electronic products, such as calculators, personal digital assistants (PDAs), watches, laptops, digital cameras, and mobile phones, etc. due to their advantages as smaller size, less weight, lower power consumption and no radiation. Furthermore, since manufacturers aggressively invest in research & development and employ large-scale fabricating equipment, the decreasing cost of production makes the TFT-LCD devices more popular.

The TFT panels on the current market are mostly traditional amorphous silicon (a-Si) TFT LCDs. Since the LTPS thin film transistor LCDs are superior in resolution, brightness, size and anti-electromagnetic interferences, the LCD manufacturers are gradually focusing on such a technical field. Considering quality of films and requirements of mass production, an excimer laser annealing is employed in the LTPS process. The excimer laser is used as a heat source and the laser light through the projection system produces laser beams with uniform energy distribution projected onto the a-Si structure on the glass substrate. After the a-Si structure on the glass substrate absorbs the energy of the excimer laser, the a-Si structure is transformed to be a poly Si structure. The entire annealing process is performed below 600° C. and a typical glass substrate can be used.

When the a-Si is transformed by laser irradiation into the poly-Si in the LTPS process, not only the silicon film is heated, but also the surface of the glass substrate under the silicon film rises in temperature by absorbing the energy of the silicon film. At this moment, the impurities in the glass substrate would diffuse into the silicon film due to high temperature and then the characteristics of the silicon film would be ruined to lose its desired semiconductor nature. To solve this problem, a buffer layer as a diffusion barrier layer is deposited between the silicon film and the glass substrate to obstruct the diffusion of the impurities.

In the current technology, the diffusion barrier layer is fabricated by increasing the density of the diffusion barrier film itself and hence, the diffusion coefficient is decreased to enhance the effect on preventing the impurities from diffusing. However, the increase in the density of the film results in a side effect of stress increase. Moreover, the thickness of the diffusion barrier film is added to alternatively enhance the effect on stopping the diffusion of the impurities, but the throughput is usually reduced in this way.

Therefore, the improvement in the fabrication of the diffusion barrier layer in the current LTPS process is urgently desired such that the diffusion barrier layer can effectively stop the impurities from diffusing.

SUMMARY OF THE INVENTION

The objective of the present invention is to provide an improvement in the structure and fabrication of multiple diffusion barrier films for a TFT LCD by the LTPS technology. By magnifying the discontinuous construction between two layers of the multiple diffusion barrier films, it can enhance the effect of the multiple diffusion barrier films on stopping the impurities from diffusing.

In a first embodiment of the present invention, a diffusion barrier multi-layer structure for LTPS thin film transistors and the process for fabricating thereof are disclosed. The diffusion barrier multi-layer structure is formed between an insulating substrate and a polysilicon film of the thin film transistor and includes a first diffusion barrier layer and a second diffusion barrier layer. The polysilicon film is above the insulating substrate. The first diffusion barrier layer is formed on the surface of the insulating substrate with a plasma treatment to increase the coarseness of the first diffusion barrier layer. The second diffusion barrier layer is formed on the surface of the first diffusion barrier layer.

Furthermore, another diffusion barrier multi-layer structure for LTPS thin film transistors and the process for fabricating thereof are disclosed in a second embodiment of the present invention. The diffusion barrier multi-layer structure is formed between an insulating substrate and a polysilicon film of the thin film transistor and includes a first diffusion barrier layer, a first impurity collecting layer and a second diffusion barrier layer. The first diffusion barrier layer is formed on the surface of the insulating substrate. The first impurity collecting layer is formed on the surface of the first diffusion barrier layer and is a porous structure. The second diffusion barrier layer is formed on the surface of the first impurity collecting layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
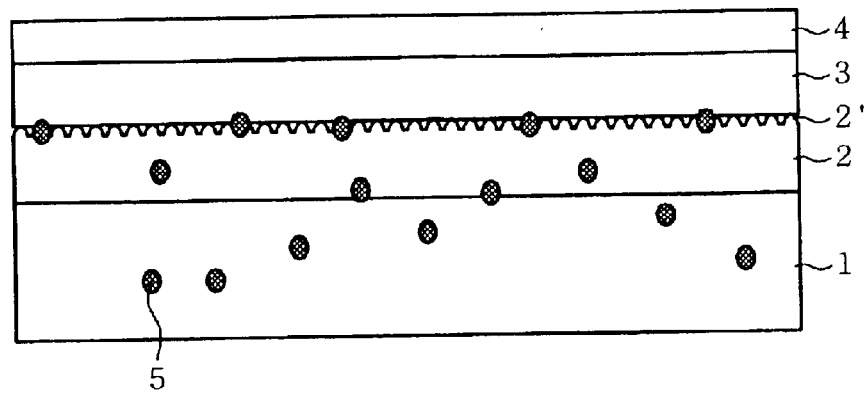
FIG. 1 is a schematic sectional view of a diffusion barrier multi-layer structure for a TFT LCD by the LTPS process in accordance with a first embodiment of this invention.

Referring to FIG. 1, it is a schematic sectional view of a diffusion barrier multi-layer structure for a TFT LCD by the LTPS process in a preferred embodiment of this invention. In this embodiment, a diffusion barrier two-layer structure is exemplified for illustrating the present invention.

As shown in FIG. 1, a first diffusion barrier layer 2 is firstly deposited on a transparent insulating substrate 1 by a chemical vapor deposition (CVD) or a sputtering technique. Generally, the insulating substrate 1 is made of glass, quartz or other similar materials. The first diffusion barrier layer 2 is made of $SiN_x$, $SiO_x$ or $SiO_xN_y$, etc.

Then, the first diffusion barrier layer 2 is treated with corrosive plasma using a $NF_3$ or $SF_6$ gas to increase the coarseness of the first diffusion barrier layer 2. Lots of defects are produced on the surface 2' of the first diffusion barrier layer 2. These defects can trap impurity atoms 5 diffusing from the insulating substrate 1 due to a subsequent heating and effectively stop the impurity atoms 5 from continuously diffusing upward into a polysilicon film 4 of the polysilicon thin film transistor. Thereafter, a second diffusion barrier layer 3 is deposited. Hence, the diffusion barrier two-layer structure is formed. Afterwards, an amorphous silicon film is deposited and transformed into the polysilicon film 4 by the excimer laser annealing.

Figure 2:
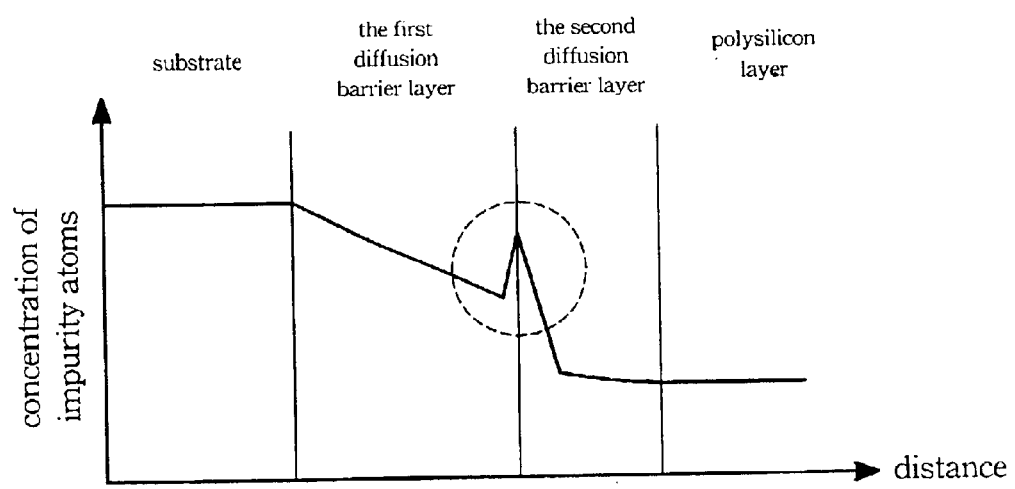
FIG. 2 is a distribution chart of impurity concentration in accordance with this invention.

As shown by the distribution chart of impurity concentration in FIG. 2, the impurity atoms will accumulate in the interface between the first diffusion barrier layer and the second diffusion barrier layer. If the diffusion barrier multi-layer structure has more than two layers, the above-mentioned plasma treatment can be performed between the other layers of the diffusion barrier multi-layer structure depending on actual needs so as to achieve the desired blocking effect.

Figure 3:
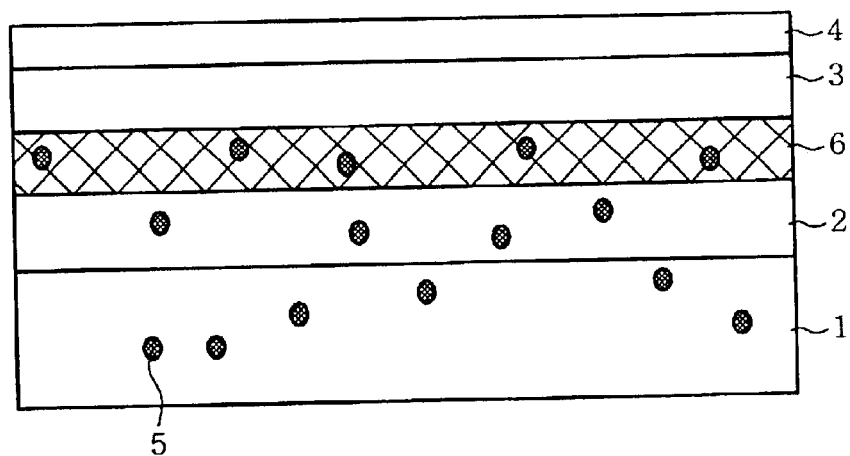
FIG. 3 is a schematic sectional view of another diffusion barrier multi-layer structure for a TFT LCD by the LTPS process in accordance with a second embodiment of this invention.

In another embodiment of this invention, as shown in FIG. 3, a porous collecting layer 6 for impurity atoms such as a $SiO_x$ film of low density, is grown between the first diffusion barrier layer 2 and the second diffusion barrier layer 3. Such a collecting layer 6 can afford an environment for tapping the impurity atoms since the structure thereof is loose and has much space for the impurity atoms to stay.

The collecting layer 6 is formed by adjustment in process parameters. For example, when it is desired to form a $SiO_x$ film of low density, the ratio of reactants $SiH_4$ with $N_2O$ or that of reactants tetra-ethyl-ortho-silicate (TEOS) with $O_2$ or with $O_3$ can be arranged. It is usually that the more is the content of $SiH_4$, the more is the porosity of the $SiO_x$ film. The less is the content of $O_2$, the less is the density of the $SiO_x$ film. Similarly, if the diffusion barrier multi-layer structure has more than two layers, the other collecting layers can be formed between the other layers of the diffusion barrier multi-layer structure depending on actual needs so as to achieve the desired blocking effect.

Therefore, the diffusion barrier multi-layer structure provided in this invention can effectively stop the impurities from diffusing without the undesired problems produced in the prior art.

As is understood by a person skilled in the art, the foregoing embodiments of the present invention are illustrations of the present invention rather than limiting the present invention. It is intended to cover various modifications and similar arrangements included within the spirit and scope of the appended claims, the scope of which should be accorded the broadest interpretation so as to encompass all such modifications and similar structure.

What is claimed is:

1. A low-temperature polysilicon (LTPS) thin film transistors comprises a diffusion barrier multi-layer structure, said diffusion barrier multi-layer structure being formed between an insulating substrate and a polysilicon film of said thin film transistor, said diffusion barrier multi-layer structure comprising:

a first diffusion barrier layer formed on the surface of said insulating substrate with a plasma treatment to increase the coarseness of the surface of said first diffusion barrier layer opposite to said insulating substrate; and a second diffusion barrier layer formed on the surface of said first diffusion barrier layer.

2. The diffusion barrier multi-layer structure of claim 1, further including a third diffusion barrier layer formed on the surface of said second diffusion barrier layer, wherein said second diffusion barrier layer is treated with plasma to increase the coarseness of said second diffusion barrier layer.

3. The diffusion barrier multi-layer structure of claim 1, wherein said first diffusion barrier layer is made of a material selected from the group consisting of $SiN_x$, $SiO_x$ and $SiO_xN_y$.

4. The diffusion barrier multi-layer structure of claim 1, wherein said plasma treatment is a corrosive plasma treatment.

5. The diffusion barrier multi-layer structure of claim 2, wherein said second diffusion barrier layer is made of a material selected from the group consisting of $SiN_x$, $SiO_x$ and $SiO_xN_y$.

6. A low-temperature polysilicon (LTPS) thin film transistor comprises a diffusion barrier multi-layer structure said diffusion barrier multi-layer structure being formed between an insulating substrate and a polysilicon film of said thin film transistor and comprising:

a first diffusion barrier layer formed on the surface of said insulating substrate;

a first impurity collecting layer formed on the surface of said first diffusion barrier layer with a porous structure; and a second diffusion barrier layer formed on the surface of said first impurity collecting layer.

7. The diffusion barrier multi-layer structure of claim 6, further comprising a third diffusion barrier layer and a second impurity collecting layer, wherein said second impurity collecting layer is formed on the surface of said second diffusion barrier layer with a porous structure, and said third diffusion barrier layer is formed on the surface of said second impurity collecting layer.

8. The diffusion barrier multi-layer structure of claim 6, wherein said first impurity collecting layer is made of $SiO_x$.

9. The diffusion barrier multi-layer structure of claim 7, wherein said second impurity collecting layer is made of $SiO_x$.

* * * * *